(12) United States Patent
Bouisse et al.

(10) Patent No.: US 9,331,664 B2
(45) Date of Patent: May 3, 2016

(54) MARCHAND BALUN AND POWER AMPLIFIER USING THE SAME

(71) Applicant: NXP B.V., Eindhoven (NL)

(72) Inventors: Gerard Jean-Louis Bouisse, Toulouse (FR); Rajeev Busgeeth, Noisy le Grand (FR)

(73) Assignee: SAMBA HOLDCO NETHERLANDS B.V., Eindhoven (NL)

( * ) Notice: Subject to any disclaimer, the term of this patent is extended or adjusted under 35 U.S.C. 154(b) by 36 days.

(21) Appl. No.: 14/300,435

(22) Filed: Jun. 10, 2014

(65) Prior Publication Data
US 2014/0368270 A1  Dec. 18, 2014

(30) Foreign Application Priority Data
Jun. 14, 2013  (EP) ..................... 13290140

(51) Int. Cl.
| | | |
|---|---|---|
| H03H 7/42 | (2006.01) | |
| H01P 5/10 | (2006.01) | |
| H03F 3/19 | (2006.01) | |
| H03F 3/21 | (2006.01) | |
| H01P 3/08 | (2006.01) | |

(52) U.S. Cl.
CPC .. *H03H 7/42* (2013.01); *H01P 5/10* (2013.01); *H03F 3/19* (2013.01); *H03F 3/21* (2013.01)

(58) Field of Classification Search
CPC ................ H03H 7/42; H01P 5/10; H01P 3/08
USPC ...................................... 333/25, 26
See application file for complete search history.

(56) References Cited

U.S. PATENT DOCUMENTS

| 5,497,137 | A | 3/1996 | Fujiki | |
|---|---|---|---|---|
| 6,097,273 | A | 8/2000 | Frye et al. | |
| 6,278,340 | B1 | 8/2001 | Liu | |
| 7,302,249 | B1 * | 11/2007 | Fudem | H03D 7/02 333/26 |
| 7,633,353 | B2 * | 12/2009 | Okabe | H01P 5/10 333/24 R |
| 7,755,447 | B2 * | 7/2010 | Oshima | H01P 5/10 333/238 |
| 8,427,388 | B2 * | 4/2013 | Fahs | H01F 17/0006 333/25 |
| 8,502,620 | B2 * | 8/2013 | Lu | H01F 21/12 333/246 |
| 2006/0175680 | A1 | 8/2006 | Saitou et al. | |
| 2010/0026412 | A1 | 2/2010 | Kirkeby | |
| 2011/0273234 | A1 | 11/2011 | Van Der Heijden et al. | |
| 2012/0119845 | A1 | 5/2012 | Lu et al. | |

FOREIGN PATENT DOCUMENTS

JP  2004 350143 A  12/2004

OTHER PUBLICATIONS

Bouisse, Gerard; „Design for balun integration in RF LDMOS; Electronic Engineering Times—Asia; 2 pages (Dec. 2006).

(Continued)

*Primary Examiner* — Dean Takaoka
(74) *Attorney, Agent, or Firm* — McDonnell Boehnen Hulbert & Berghoff LLP (57) ABSTRACT

A Marchand balun has a primary transmission line with a width smaller than the two secondary transmission lines. The two secondary transmission lines also have different widths and lengths. This arrangement provides an imbalance between the widths and lengths of the transmission lines. It has been found that this imbalance can enable improved amplitude unbalance and phase unbalance.

14 Claims, 8 Drawing Sheets

(56) References Cited

OTHER PUBLICATIONS

Huang, C-H, et al; "Design of integrated planar Marchand balun using physical transformer model"; IEEE Microwave Conference Asia Pacific; IEEE, Piscataway, NJ, USA; pp. 1004-1007 (Dec. 7, 2009).

Ercoli, Mariano, et al; "An Ultra Small Passive Balun for 60 GHz Applications in CMOS 65nm Technology"; IEEE International NEWCAS Conference, Montreal, CN; 4 pages (2010).

Extended European Search Report for Application No. 13290140.6 (Dec. 12, 2013).

\* cited by examiner

MARCHAND BALUN AND POWER AMPLIFIER USING THE SAME

CROSS-REFERENCE TO RELATED APPLICATIONS

This application claims the priority under 35 U.S.C. §119 of European patent application no. 13290140.6, filed on Jun. 14, 2013, the contents of which are incorporated by reference herein.

The invention relates to a Marchand balun, for example for use at the input of a power amplifier (PA).

Baluns are used to convert between balanced (differential) and unbalanced (single ended) signal formats.

An unbalanced signal (common mode) is referenced to ground whereas the balanced signal propagates on two channels and is not referenced to ground. The balanced signals have the same magnitude on each port but with a phase difference of 180°. Thus there is a virtual ground at the midpoint of the two output channels.

Figure 1:
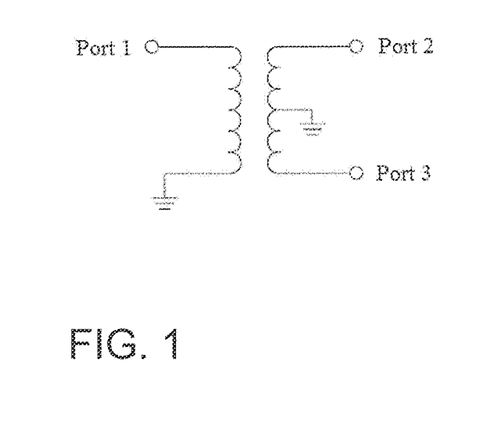
FIG. 1 shows a schematic circuit diagram of a balun.

FIG. 1 shows a simplified schematic of a balun. On one side, there is a single ended port (Port 1), and on the other side there is a pair of differential ports (Port 2 and Port 3). The balun can be used in either direction.

Baluns are key components in balanced mixers, push-pull amplifiers and antennas. Some baluns also provide impedance transformation in addition to conversion between unbalanced and balanced signal modes.

In theory, an ideal balun delivers on the two differential channels signals of equal magnitude and of opposite phase of 180°, but this rarely achievable practically. A balun is always subject, to imbalances in amplitude and phase. These parameters have a negative effect on the performances of the circuitry which processes the differential signals and should therefore be minimized, as well as the insertion loss.

Figure 2:
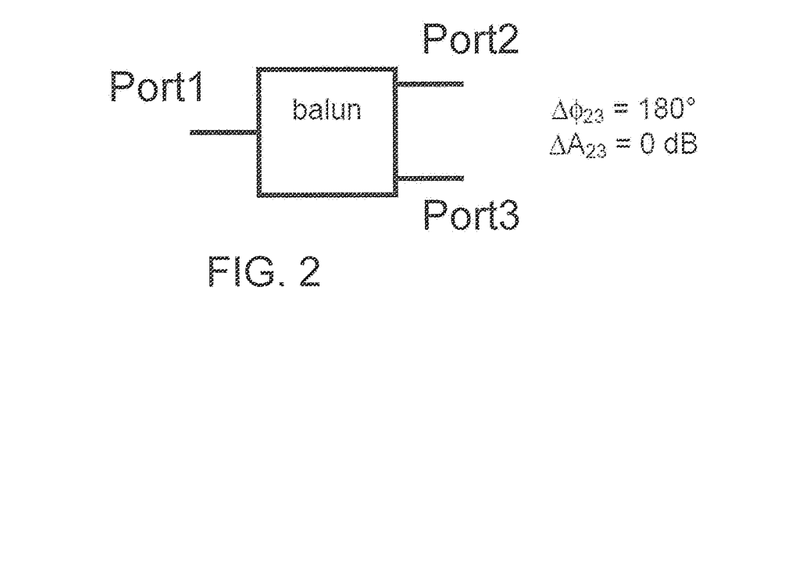
FIG. 2 shows the ideal characteristics of a balun.

FIG. 2 shows the properties of an ideal balun as explained above.

SUMMARY

The invention is of particular interest for a power (differential) amplifier for example using LDMOS (laterally diffused metal oxide semiconductor) technology. This technology was introduced into the RF power market more than 10 years ago as replacement of bipolar devices. Nowadays LDMOS is considered as technology of choice for many RF power applications like base stations, broadcast and radar-microwave systems.

LDMOS is very reliable, rugged and cost effective in combination with best-in-class RF performance. LDMOS transistors for cellular base stations power amplifiers have gone through a tremendous development with a spectacular improvement in available output power, power gain, power added efficiency and linearity together with improvements in hot carrier reliability and thermal resistance.

This invention relates in particular to an integrated balun design suitable for use in such RF power amplifiers. Baluns are extensively used in microwave applications.

As explained above, amplitude and phase imbalances can deteriorate the performances of the balun. It is explained below how exactly the imbalance these two parameters have an impact on a push-pull power amplifier.

Two signals $v_1(t)=V1\cos(\omega t)$ and $v_2(t)=V2\cos(\omega t)$ can be defined which are applied to the balun and $v(t)=V\cos(\omega t)$ the resulting signal at the output (assuming the balanced side is the input and the unbalanced side is the output).

In order to determine the loss generated by the phase imbalance, $v1(t)$ and $v2(t)$ can be assumed to have the same amplitude but the phase slightly different to 180°:

$$v_1(t)=V\cos(\omega t) \text{ and } v_2(t)=V\cos(\omega t+\Delta\phi).$$

The power, P delivered to a load R is equal to:

$$P = \frac{|V(t)|^2}{R}; v(t) = v_1(t) + v_2(t)$$

$$v(t) = 2V\cos\left(\frac{\Delta\varphi}{2}\right)\cos\left(\omega t + \frac{\Delta\varphi}{2}\right)$$

$$\Leftrightarrow |P| = \frac{4V^2}{R}\left[\cos\left(\frac{\Delta\varphi}{2}\right)\right]^2$$

If $\Delta\varphi = 0$, then $|P| = \frac{4V^2}{R}$

This implies that the loss is equal to:

$$\frac{4V^2}{R}\left[1 - \left[\cos\left(\frac{\Delta\varphi}{2}\right)\right]^2\right]$$

$$\text{Loss(dB)} = 10*\log_{10}\left(\frac{\text{Loss}}{|V1|^2/R}\right) = 10*\log_{10}\left[1 - \left[\cos\left(\frac{\Delta\varphi}{2}\right)\right]^2\right]$$

Figure 3:
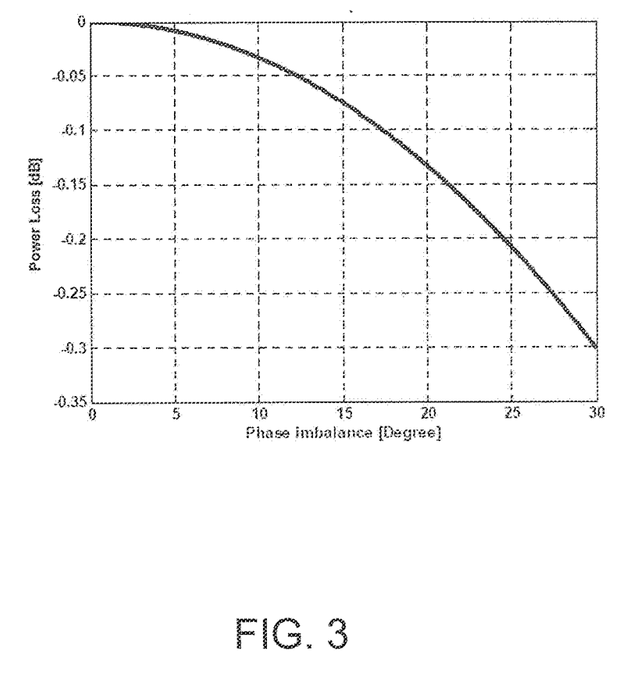
FIG. 3 shows the effect of phase imbalance on power loss.

FIG. 3 shows a graph of the power loss vs. the phase imbalance. Phase imbalance has little effect on power loss (less than 0.1 dB) up to 18 degrees of phase imbalance.

For amplitude imbalance, $v_1(t)$ and $v_2(t)$ can be considered as having different amplitudes but having the same phase.

The power delivered to a load R is equal to:

$$P = \left(\frac{|V1|^2}{R} + \frac{|V2|^2}{R}\right)*\cos(\omega t)$$

$$P = \frac{|V1|^2}{R}\left(1 + \frac{|V2|^2}{|V1|^2}\right)*\cos(\omega t)$$

If $V2 = V1$, then $P = 2*\frac{|V1|^2}{R}\cos(\omega t)$

This implies that the loss is equal to:

$$\left[\left(2*\frac{|V1|^2}{R}\right) - \left(\frac{|V1|^2}{R}\left(1 + \frac{|V2|^2}{|V1|^2}\right)\right)\right]\cos(\omega t)$$

$$\Leftrightarrow \text{Loss} = \left[\frac{|V1|^2}{R}\left(1 - \frac{|V2|^2}{|V1|^2}\right)\right]\cos(\omega t)$$

$$\Leftrightarrow \frac{\text{Loss}}{|V1|^2/R} = \left[\left(1 - \frac{|V2|^2}{|V1|^2}\right)\right]\cos(\omega t)$$

$$\Leftrightarrow \text{Loss(dB)} = 10*\log_{10}\left(\frac{\text{Loss}}{|V1|^2/R}\right) = 10*\log_{10}\left[\left(1 - \frac{|V2|^2}{|V1|^2}\right)\right]$$

Figure 4:
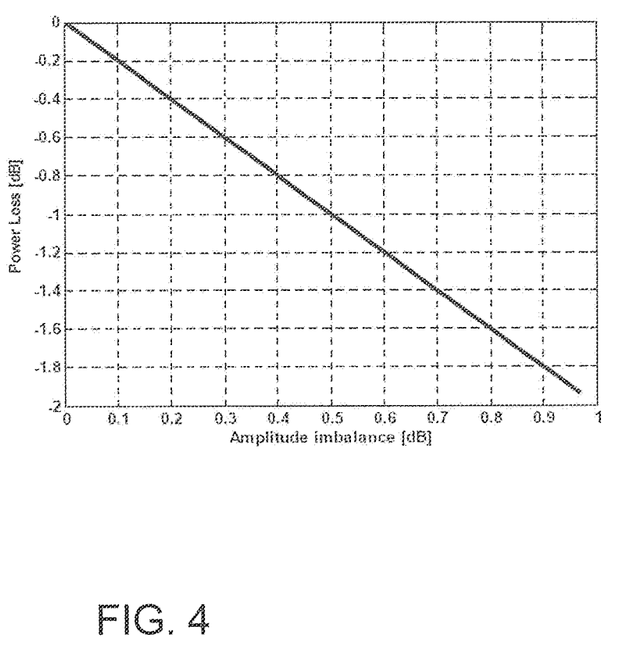
FIG. 4 shows the effect of amplitude imbalance on power loss.

FIG. 4 shows a graph of the power loss vs. the amplitude imbalance.

From the graph of FIG. 4, it can be seen that power loss is critical even for small amplitude imbalances. Since a push-pull configuration requires two baluns, a total amplitude imbalance of 0.2 dB may be desired (considering 0.1 dB amplitude imbalance each). Hence, the design should consider amplitude imbalance as an important issue.

There are different types of balun, but this invention is concerned with coupled line baluns. These are very popular within microwave frequencies as they allow the realization of compact broadband baluns. The most attractive topology is the Marchand balun due to its wideband performance. It consists of two quarter wavelength coupled line sections and exhibits very good amplitude and phase balance.

Figure 5:
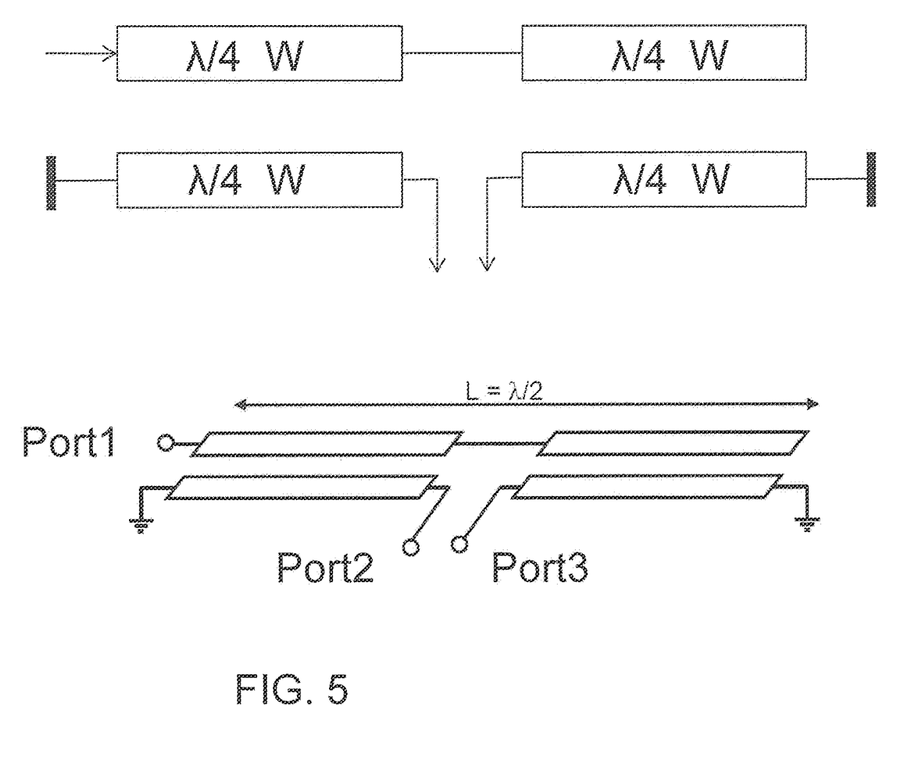
FIG. 5 shows a schematic diagram of a known Marchand balun.

The Marchand balun is shown in schematic form in FIG. 5.

The conventional basic Marchand balun consists of two-quarter wavelength microstrip coupled line sections. A primary transmission line combined both quarter wavelength sections in series, and is defined from a first input (Port 1) to an open end. It thus has a length approximately corresponding to half of a wavelength within an intended frequency operating range.

A first secondary transmission line extends from a first output (Port 2) to ground having a length corresponding to quarter of a wavelength within an intended operating range. A second secondary transmission line extends from ground to a second output (Port 3) having a length corresponding to a quarter of a wavelength within an Intended operating range.

This definition of ports assumes conversion from unbalanced to balanced format. However, if should be understood that this is not limiting.

To design the balun, the central working frequency is used to derive the lengths. For example for a working frequency 2 GHz, the first step is to calculate the length, l of the microstrip lines using the following formulas:

$$c = f\lambda_0; \lambda_g = \frac{\lambda_0}{\sqrt{\xi r}}$$

$$l = \frac{\lambda_g}{4} = \frac{c}{4\sqrt{\xi r}f}$$

where $\lambda_g$ is the guided wavelength, $\lambda_0$ the wavelength in free space, $\xi r=11.9$, the permittivity of the substrate and c the speed of propagation. The length of the line is found to be approximately 11 mm, based on $c=3\times10^8$ m/s, $f=2$ GHz and $\xi r=11.9$.

In this description and claims, the reference to a transmission line length "corresponding to" a wavelength fraction is intended to refer to the relationship above. This is in accordance with the conventional meaning of a quarter wave or half transmission line length.

The phase imbalance of a conventional Marchand balun is good and the amplitude imbalance is relatively flat within the bandwidth, but the amplitude imbalance needs to be improved if more stringent requirements are to be set. Moreover the fosses at the two outputs when using a highly conductive silicon substrate are around 7 decibels, which is not insignificant. This loss is thus a particular problem for LDMOS applications.

The invention aims to provide a Marchand balun with improved performance and which can be integrated with highly conductive substrates.

The invention is defined by the claims.

According to the invention, there is provided a Marchand balun, comprising:

a primary transmission line from a first primary port to an open termination having a length corresponding to half of a wavelength within an intended operating range;

a first secondary transmission line from a first secondary port to ground having a length corresponding to quarter of a wavelength within an intended operating range;

a second secondary transmission line from ground to a second secondary port having a length corresponding to a quarter of a wavelength within an intended operating range, the first and second secondary transmission lines each being electromagnetically coupled with and following the shape of a respective section of the primary transmission line;

wherein the primary transmission line has a width smaller than the second secondary transmission line, and the second secondary transmission line has a width smaller than the first secondary transmission line, and wherein the first secondary transmission line is longer than the second secondary transmission line.

This arrangement provides an imbalance between the widths and lengths of the transmission lines. It has been found that this imbalance can enable improved amplitude unbalance and phase unbalance.

In particular, it enables a balun to be designed with an amplitude and phase imbalance less than 0.1 dB and 8 degrees respectively. The performance of the balun determines that of a power amplifier (PA) in which it is to be used, and with these specifications the loss can be reduced drastically.

The primary port can be a single ended input, and the secondary ports can be the differential outputs. However, the secondary ports can instead be differential inputs, and the primary port a single ended output. The invention is however of particular interest for use as a divider.

The width of the second secondary transmission line can be more than twice the width of the primary transmission line and the width of the first secondary transmission line can be more than three times the width of the primary transmission line.

The first secondary transmission line can comprise a coil shape with a ground connection at the centre and the first secondary port at the periphery, and the second secondary transmission line can comprise a coil shape with a ground connection at the centre and the second secondary port at the periphery.

This provides a compact arrangement which can occupy a small circuit area.

The first secondary transmission line can be up to 20% longer than the second secondary transmission line, preferably only up to 10% longer. Thus, the length differences between the secondary lines are less significant than the width differences.

By way of example the primary transmission line can have a width of 3 µm to 10 µm (e.g. 5 µm), the first secondary transmission line can have a width of 20 µm to 40 µm (e.g. 30 µm) and the second secondary transmission line can have a width of 10 to 20 µm (e.g. 15 µm).

The primary transmission line can have a length of 5 mm to 15 mm (e.g. 10 mm to 12 mm), and the first and secondary transmission lines have a length of 2.5 mm to 7.5 mm (e.g. 4.4 mm to 4.8 mm for one and 4.8 mm to 5.2 mm for the other).

The balun can be formed on a high conductivity substrate.

The balun of the invention be used as an input balun of a power amplifier, in which the input balun converts an RF input into a differential pair of RF signals, and an amplifier circuit amplifies the differential signals.

The amplifier circuit can comprise a push pull amplifier stage or two push-pull amplifier stages with a matching network between.

In one design an input matching network is provided between the input balun and the amplifier circuit, and the input balun, input matching network and amplifier circuit are formed as a monolithic microwave integrated circuit, MMIC. The power amplifier further comprises an output matching network and an output balun for converting to a single ended output, the output matching network and output balun formed outside the MMIC (which can be an LDMOS circuit).

BRIEF DESCRIPTION OF THE DRAWINGS

Examples of the invention will now be described in detail with reference to the accompanying drawings, in which.

DETAILED DESCRIPTION

The invention provides a Marchand balun which has a primary transmission line with a width smaller than the two secondary transmission lines. The two secondary transmission lines also have different widths and lengths. This arrangement provides an imbalance between the widths and lengths of the transmission lines. It has been found that this imbalance can enable improved amplitude unbalance and phase unbalance.

Figure 6:
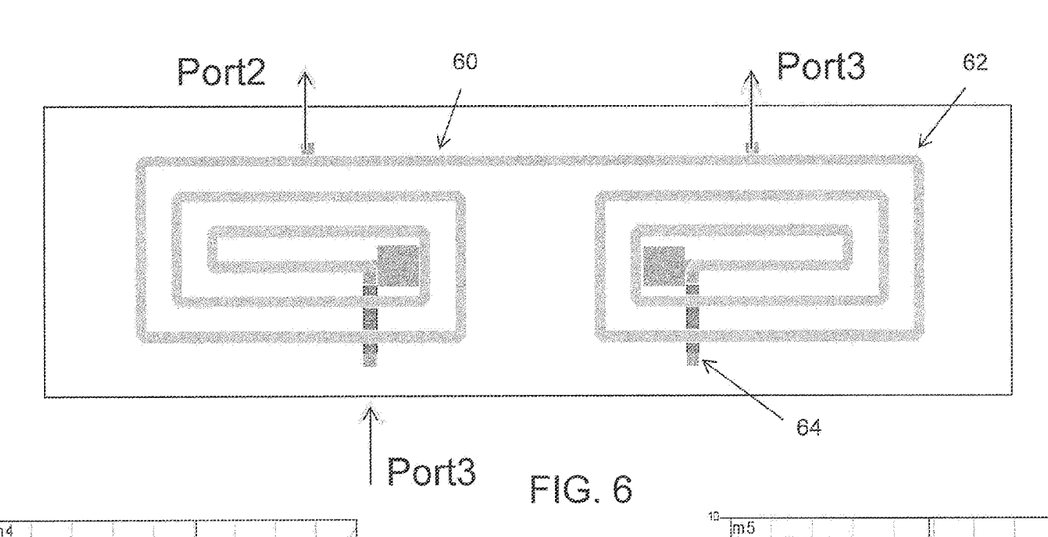
FIG. 6 shows one possible track layout for a known Marchand balun.

FIG. 6 one possible track layout for the known Marchand balun design.

Each secondary transmission line is formed as a coil. The first secondary transmission line 60 has a ground connection at the centre and the first output (Port 2) at the periphery. The second secondary transmission line 62 comprises a ground connection at the centre and the second output (Port 3) at the periphery. These two secondary coils overlap with the primary coil, which extends from the input (Port 1) to an open termination at end 64.

Thus, in FIG. 6, the primary coil is beneath the two secondary coils. The coils have the same width and the two secondary coifs have the same length. This width can for example be 30 μm. When formed an part of an integrated circuit, the primary transmission line can be formed from one metal layer of the IC structure, and the overlying secondary transmission lines can be formed from the next higher metal layer of the IC.

Figure 7:
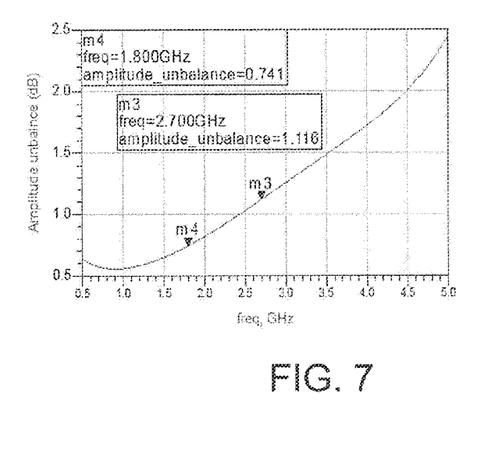
FIG. 7 shows the amplitude imbalance as a function of frequency.
Figure 8:
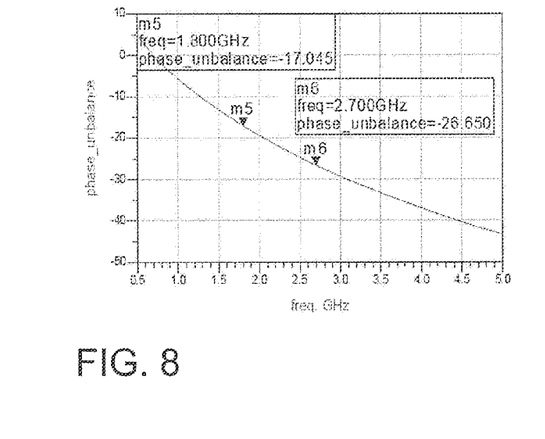
FIG. 8 shows the phase imbalance as a function of frequency.

FIG. 7 shows the corresponding amplitude imbalance as a function of frequency (with two specific examples), and FIG. 8 shows the corresponding phase imbalance as a function of frequency (with the same two specific examples of frequency).

There are several parameters in the balun design that can be modified:
the width of the microstrip lines;
the length of the microstrip lines;
the design topology;
the symmetry of the topology;
the input and output impedances.

Figure 9:
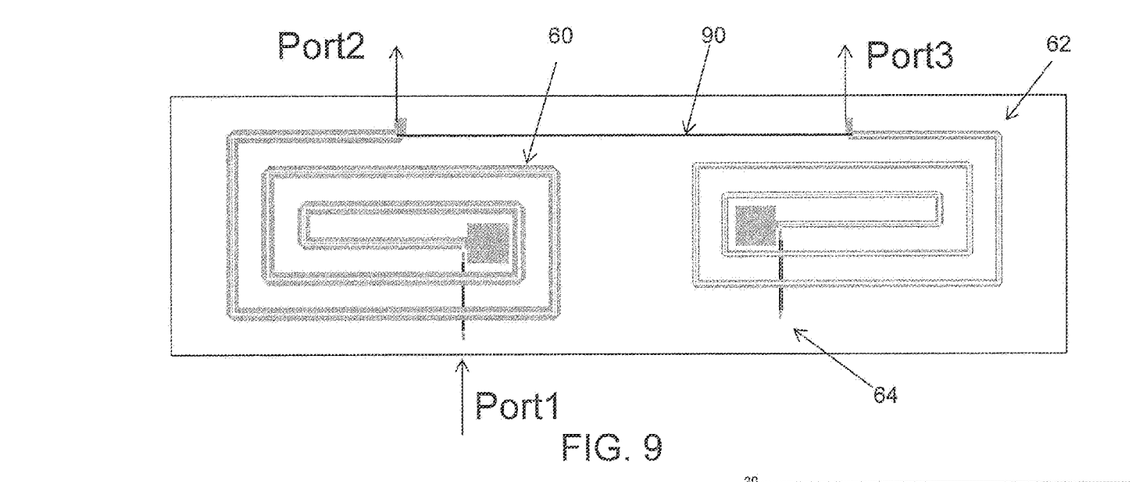
FIG. 9 shows one possible track layout for a Marchand balun of the invention.

FIG. 9 shows the layout of one example of the invention.
The basic layout is the same. However, the primary transmission line 90 has a width smaller than the second secondary transmission line 62, and the second secondary transmission line 62 has a width smaller than the first secondary transmission line 60. The first secondary transmission line 60 is also longer than the second secondary transmission line 62.

The Marchand balun of the invention can be designed with a size of 1.95×0.473 mm$^2$, and in this example of design the microstrip lines have the following characteristics:

|  | Primary | Secondary(left) | Secondary(right) |
| --- | --- | --- | --- |
| Length (mm) | 10.6 | 4.97 | 4.6 |
| Width (μm) | 5 | 30 | 15 |

The secondary transmission lines each still have a length corresponding to a quarter wavelength—for a frequency within the intended operating range. The lengths are slightly different, so that they correspond to slightly different frequencies, for example each side of the centre frequency (2 GHz based on the example above), but within the operating range (1.8 GHz to 2.7 GHz based on the example above).

The primary transmission line still corresponds to a half wavelength.

Figure 10:
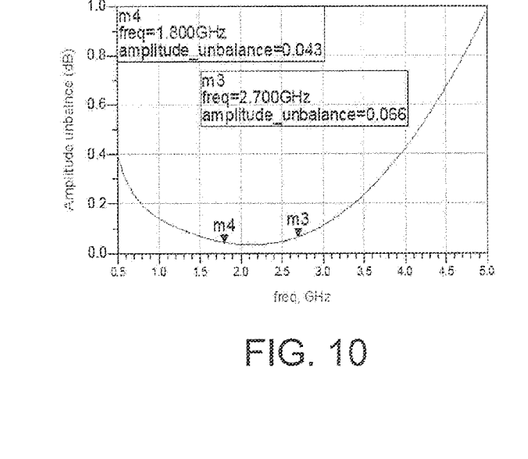
FIG. 10 shows the amplitude imbalance as a function of frequency.
Figure 11:
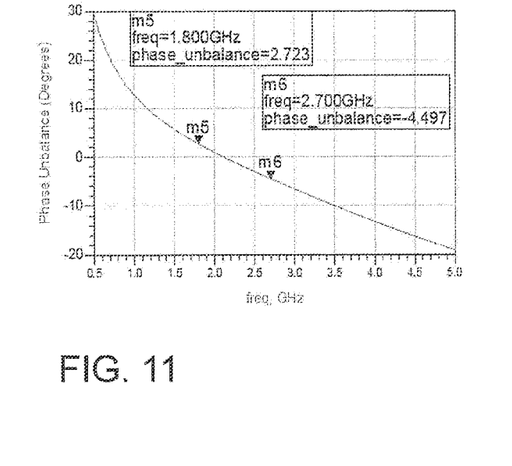
FIG. 11 shows the phase imbalance as a function of frequency.

FIG. 10 shows the corresponding amplitude imbalance as a function of frequency (with two specific examples), and FIG. 11 shows the corresponding phase imbalance as a function of frequency (with the same two specific examples of frequency).

Figure 12:
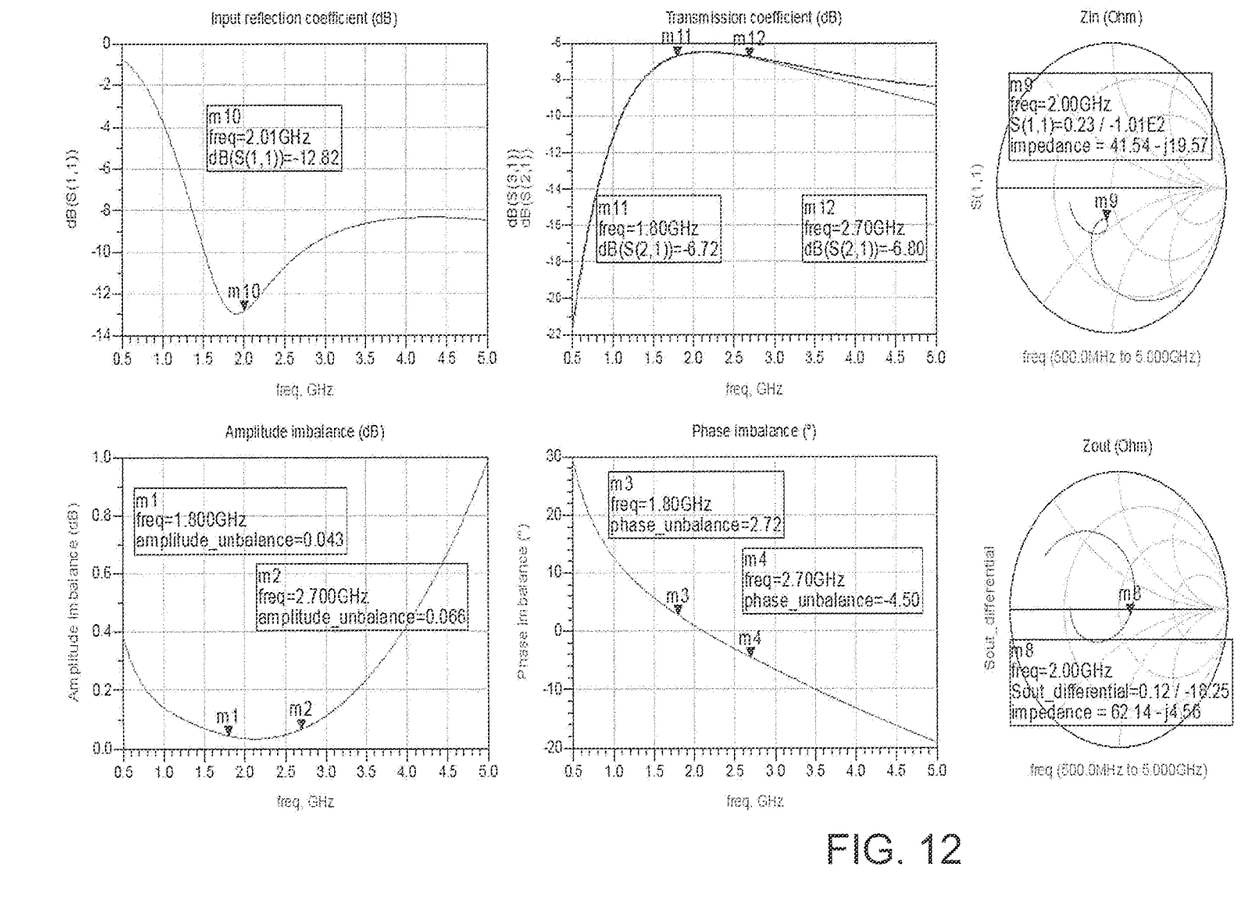
FIG. 12 additionally shows the input reflection coefficient, transmission coefficient, S(1,1) plot and output reflection coefficient plot.

The amplitude and phase imbalance plots are repeated in FIG. 12, which additionally shows the input and output reflection coefficients in both Smith Chart and grid format, the transmission coefficient being expressed in absolute logarithmic value.

The modified Marchand balun shows very good results. First of all, it shows an amplitude imbalance less than 0.07 dB and a phase imbalance less 4.5 degrees throughout the desired bandwidth. The input reflection coefficient is less than −10 dB and the insertion loss is around 4.7 dB. These are very good results.

Even though the design specifications are achieved, the topology of this balun is quite uncharacteristic; it is asymmetric. Generally, it is understood that amplitude and phase imbalances are reduced when the widths of the primary and secondary lines are of equal dimensions and also the lengths of the secondary lines, thus making a symmetric topology.

The improved performance based on the asymmetrical design is partly due to the conductive nature of the substrate, which generates the most loss. The invention is for example for very conductive substrates, such as silicon substrates with low resistivity of around 10 mΩ-cm, and generally below 20 mΩ-cm.

Having a smaller primary line width brings about more coupling of the electromagnetic field generated by the primary line into the secondary line. Decreasing the value of the width of the primary line causes an asymmetry in the topology. Hence to compensate this asymmetry, the length of one of the secondary lines needs to be adjusted so that the phase and amplitude imbalances become negligible.

The design of FIG. 9 is based on the following specifications within the 1.8-2.7 GHz bandwidth:
   an amplitude imbalance <0.1 dB;
   a phase imbalance <8°;
   a return loss <−10 dB;
   A low insertion loss is also possible.

As outlined above, one use of the balun is in Power Amplifiers (PAs).

Power amplifiers are being used in many diverse applications and systems. The most important parameters that must be considered when designing PAs are the Power (in dBm or dB), Efficiency (%), Gain (dB), Linearity and Stability.

In RF-microwave circuits, the power available from the source and the power transferred to, or dissipated in, the load are important. The available power is the maximum power accessible from the source. The maximum available power is obtained from the source if the input impedance of the transistor is the conjugate match with respect to the source impedance (Zin=Zs*).

Efficiency is one of the most important parameters in power amplifier design. It represents the part of the dc power that is converted to RF power. The most commonly used definitions in power amplifier designs for the efficiency are the drain efficiency and the power added efficiency.

RF power amplifiers are inherently non-linear and are the main contributors for distortion products in a transceiver chain. Non-linearity is typically caused due to the compression behaviour of the power amplifier, which occurs when the RF transistor operates in its saturation region due to a certain high input level. Usually non-linearity is attributed to gain compression and harmonic distortions resulting in imperfect reproduction of the amplified signal. It is characterized by various techniques depending upon specific modulation and application. Some of the widely used figures for quantifying linearity are:
   the 1 dB compression point defines the output level at which the amplifier's gain is 1 dB less than the small signal gain, or compressed by 1 dB (P1 dB);
   the third order intermodulation distortion, intermodulation distortion occurs when two or more signals occupy the same transmission paths as in full duplex systems. When the signals mix, a non-linear response manifests itself as byproducts of the fundamental frequency called intermodulation distortion or IMD;
   the third order intercept point (IP3). This parameter plays a major role in the analysis of device performance, because higher the IP3, lower is the distortion at higher power levels.

Figure 13:
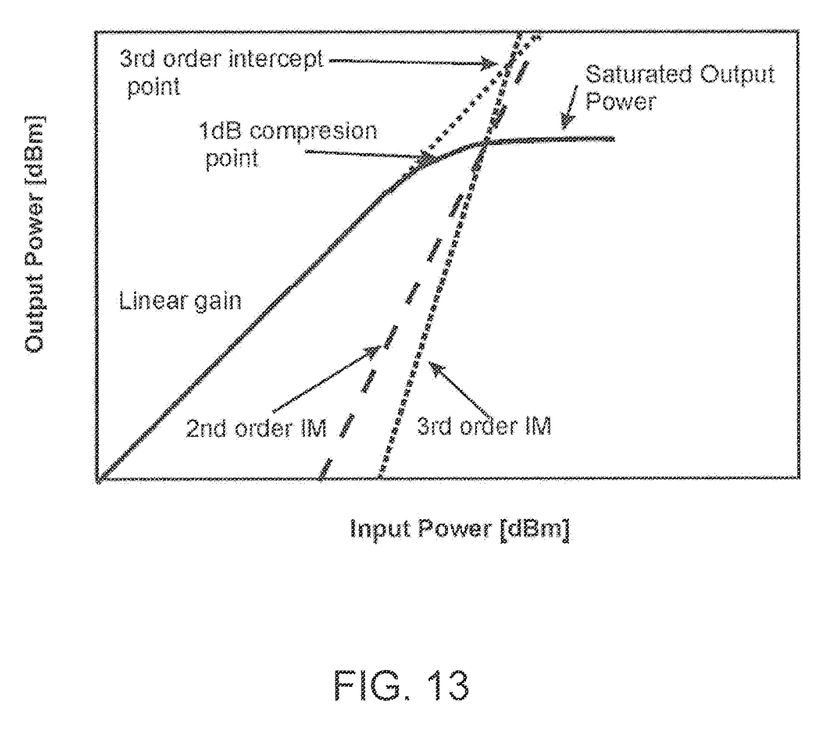
FIG. 13 shows various power amplifier parameters.

FIG. 13 shows a graphical explanation of the 1 dB compression point, intermodulation products and intercept points of the PA transfer characteristics.

One of the first requirements that an amplifier circuit must meet is a stable performance in the frequency range of interest. This is a particular concern when dealing with RF circuits, which tend to oscillate depending on operating frequency and termination.

Figure 14:
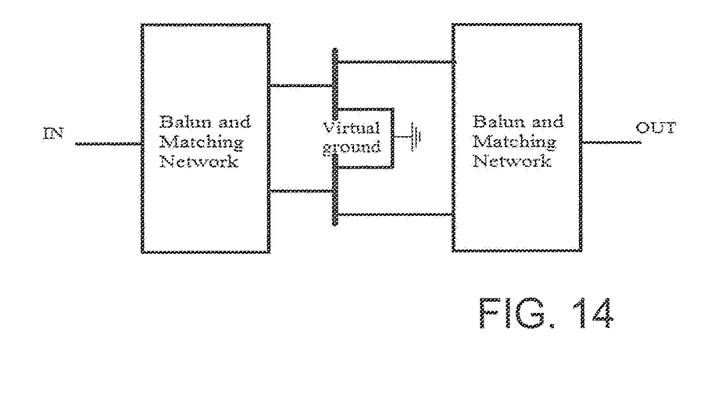
FIG. 14 shows the basic circuit diagram for a push pull power amplifier.

The only PA configuration in which a proper ground connection is not necessary is the push-pull configuration, also called the differential configuration. The single ended input signal is split by 3 dB and with a phase shift of 180 degrees with the use of baluns. Then, the upper and lower sinusoid half are amplified separately by each transistor. In this configuration, the two transistors are usually operated in the AB-class with a virtual ground between as shown in FIG. 14, which shows the basic push-pull configuration.

Finally, the signals are joined, again with a phase shift of 180 degrees by another balun.

This configuration brings about some interesting advantages. First of all there is no need for a perfect ground connection as there exists a virtual ground due to the symmetry of the topology. Thus, the design is free from losses and parasitics created due to the ground connections. Furthermore, using an integrated input balun minimizes the losses due to impedance matching. Another advantage of the push-pull configuration is the suppression of second order harmonics.

Figure 15:
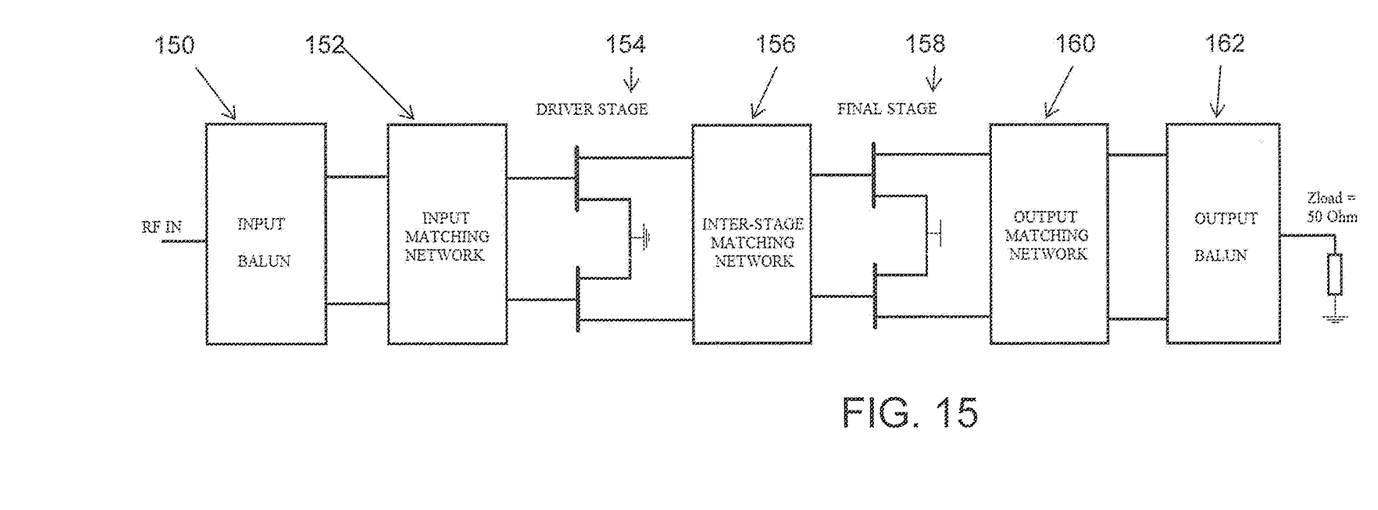
FIG. 15 shows the basic circuit diagram for a two stage push pull power amplifier using the balun of the invention at the input.

One PA design of particular interest is the two stage Push-Pull PA. The topology is shown in FIG. 15.

It consists of an integrated input balun 150, an input matching network 152, the main driver stage 154, an inter-stage matching network 156, a final driver stage 158, an output matching network 180 and the output balun 162.

An integrated MMIC two stage push-pull PA can be formed in which the input balun up to the final driver stage are integrated. The output matching network and the output balun will be on the printed circuit board (PCB) with a different substrate.

The power amplifier can for example be capable of delivering an output power of 20 Watt, with a constant gain in 1.8-2.2 GHz bandwidth, and efficiency greater of equal than 50 percent. This PA consists of a driver stage and a final stage and an inter-stage matching network between. This matching network should be broadband and at the same time have the least loss possible.

The balun design of the invention, can be used as the integrated input balun.

Examples of the invention enable a broadband MMIC to be implemented, with a two-stage push-pull power amplifier in the 1.8-2.2 GHz frequency range using Si-LDMOS technology, together with an integrated balun. The invention enables a broadband integrated balun with very good amplitude and phase imbalance, low insertion loss and with minimum dimensions.

These power amplifiers can be used for base station applications, where bit rate (video bandwidth "VBW") is of prime importance. The use of a push-pull differential RF power amplifier is of particular interest in such applications. The true differential nature of the amplifier corresponds to almost zero embedded capacitance in the package, and therefore pushes the VBW performance very far. The differential nature of the amplification makes the amplifier insensitive to common source inductance (which is worsened by the desired packaging solutions). The push-pull amplifier requires the input and output balun functions (split and outphasing at the and combining and outphasing at output).

The balun of the invention can be used in many applications such as low noise amplifiers, mixers and antennas. The invention is of particular interest for integration into a circuit using conductive silicon, as is the case for LDMOS circuits such as power amplifiers.

The balun of the invention is used as the input balun of the LDMOS power amplifier. As a result of the substrate loss, the balun is not used as the output balun. The integration at the input is possible because the loss only affects the gain, which can be overcome in the amplifier. By integrating the balun at the input, the circuit can be used with a conventional MMIC with 50 ohms single ended input.

Various modifications will be apparent to those skilled in the art.

The invention claimed is:

1. A Marchand balun, comprising:
   a primary transmission line from a first primary port (Port 1) to an open termination having a length corresponding to half of a wavelength within an intended operating range;
   a first secondary transmission line from a first secondary port (Port 2) to ground having a length corresponding to quarter of a wavelength within an intended operating range;
   a second secondary transmission line from ground to a second secondary port (Port 3) having a length corresponding to a quarter of a wavelength within an intended operating range, the first and second secondary transmission lines each being electromagnetically coupled with and following the shape of a respective section of the primary transmission line;
   wherein the primary transmission line has a width smaller than the second secondary transmission line, and the second secondary transmission line has a width smaller than the first secondary transmission line, and
   wherein the first secondary transmission line is longer than the second secondary transmission line.

2. A balun as claimed in claim 1, wherein the width of the second secondary transmission line is more than twice the width of the primary transmission line.

3. A balun as claimed in claim 1, wherein the width of the first secondary transmission line is more than three times the width of the primary transmission line.

4. A balun as claimed in claim 1, wherein the first secondary transmission line comprises a coil shape with a ground connection at the center and the first secondary port at the periphery.

5. A balun as claimed in claim 1, wherein the second secondary transmission line comprises a coil shape with a ground connection at the center and the second secondary port at the periphery.

6. A balun as claimed in claim 1, wherein the first secondary transmission line is up to 20% longer than the second secondary transmission line.

7. A balun as claimed in claim 1, wherein the primary transmission line has a width of 3 μm to 10 μm, the first secondary transmission line has a width of 20 μm to 40 μm and the second secondary transmission line has a width of 10 μm to 20 μm.

8. A balun as claimed in claim 1, wherein the primary transmission line has a length of 5 mm to 15 mm, and the first and secondary transmission lines have a length of 2.5 mm to 7.5 mm.

9. A balun as claimed in claim 1, comprising a substrate with resistivity less than 20 mΩ-cm.

10. A power amplifier comprising:
    an input balun for converting an RF input into a differential pair of RF signals, wherein the balun is as claimed in claim 1; and
    an amplifier circuit.

11. An amplifier as claimed in claim 10, wherein the amplifier circuit comprises a push-pull amplifier stage.

12. An amplifier as claimed in claim 11, wherein the amplifier circuit comprises two push-pull amplifier stages with a matching network in between.

13. An amplifier as claimed in claim 12, further comprising
    an input matching network between the input balun and the amplifier circuit, and
    wherein the input balun, input matching network and amplifier circuit are formed as a monolithic microwave integrated circuit, MMIC, and the power amplifier further comprises an output matching network and an output balun for converting to a single ended output, the output matching network and output balun formed outside the MMIC.

14. An amplifier as claimed in claim 10, comprising an LDMOS (laterally diffused metal oxide semiconductor) circuit.

* * * * *